United States Patent
Matsumoto et al.

(10) Patent No.: US 9,154,085 B2
(45) Date of Patent: Oct. 6, 2015

(54) SYSTEMS AND METHODS FOR ADAPTIVE POWER AMPLIFIER LINEARIZATION

(71) Applicant: Aviat U.S., Inc., Santa Clara, CA (US)

(72) Inventors: Frank Matsumoto, San Ramon, CA (US); Youming Qin, Sunnyvale, CA (US)

(73) Assignee: Aviat U.S., Inc., Santa Clara, CA (US)

( * ) Notice: Subject to any disclaimer, the term of this patent is extended or adjusted under 35 U.S.C. 154(b) by 0 days.

(21) Appl. No.: 14/314,906

(22) Filed: Jun. 25, 2014

(65) Prior Publication Data

US 2014/0306757 A1 Oct. 16, 2014

Related U.S. Application Data

(63) Continuation of application No. 13/633,066, filed on Oct. 1, 2012, now Pat. No. 8,766,718.

(60) Provisional application No. 61/541,894, filed on Sep. 30, 2011.

(51) Int. Cl.
*H03F 1/26* (2006.01)
*H03F 3/00* (2006.01)
*H03F 1/32* (2006.01)
(Continued)

(52) U.S. Cl.
CPC ............ *H03F 1/3247* (2013.01); *H03F 1/56* (2013.01); *H03F 3/211* (2013.01); *H03F 3/24* (2013.01); *H03F 2200/204* (2013.01); *H03F 2200/207* (2013.01); *H03F 2200/387* (2013.01); *H03F 2200/405* (2013.01); *H03F 2200/408* (2013.01);
(Continued)

(58) Field of Classification Search
USPC ............................. 330/149, 124 R, 278, 107
IPC ...................................... H03F 1/26; H03G 3/00
See application file for complete search history.

(56) References Cited

U.S. PATENT DOCUMENTS 5,260,670 A 11/1993 Ainsworth et al.
5,430,893 A 7/1995 Myer
(Continued)

FOREIGN PATENT DOCUMENTS

JP 2002064340 2/2002

OTHER PUBLICATIONS

International Application No. PCT/US20121058352, International Search Report and Written Opinion, Dec. 11, 2012.
(Continued)

*Primary Examiner* — Patricia T Nguyen
(74) *Attorney, Agent, or Firm* — Sheppard, Mullin, Richter & Hampton LLP

(57) ABSTRACT

An exemplary system comprises a linearizer, a power amplifier, and a feedback block. The linearizer may be configured to use a predistortion control signal to add predistortion to a receive signal to generate a predistorted signal. The power amplifier may be configured to amplify power of the predistorted signal to generate a first amplified signal. The power amplifier may also add high side and low side amplifier distortion to the predistorted signal. The high side and low side amplifier distortion may cancel at least a portion of the predistortion. The feedback block may be configured to capture a feedback signal based on a previous amplified signal from the power amplifier, to determine high side and low side distortion of the captured feedback signal, and to generate the predistortion control signal based on the determined high side and low side distortion.

19 Claims, 6 Drawing Sheets

(51) Int. Cl.
*H03F 3/24* (2006.01)
*H03F 1/56* (2006.01)
*H03F 3/21* (2006.01)

(52) U.S. Cl.
CPC ... *H03F 2200/411* (2013.01); *H03F 2201/3227* (2013.01)

(56) References Cited

U.S. PATENT DOCUMENTS

| | | | |
|---|---|---|---|
| 5,604,462 A * | 2/1997 | Gans et al. | 330/124 R |
| 5,877,653 A * | 3/1999 | Kim et al. | 330/149 |
| 6,359,508 B1 * | 3/2002 | Mucenieks | 330/149 |
| 6,486,734 B2 | 11/2002 | Oguro et al. | |
| 6,522,198 B2 | 2/2003 | Ahn | |
| 6,753,728 B2 | 6/2004 | Okubo et al. | |
| 6,989,713 B2 | 1/2006 | Matsuura et al. | |
| 6,993,090 B2 * | 1/2006 | Kusunoki | 375/296 |
| 7,142,615 B2 | 11/2006 | Hongo et al. | |
| 7,170,342 B2 | 1/2007 | Suzuki et al. | |
| 7,196,576 B2 | 3/2007 | Mizuta et al. | |
| 7,460,500 B2 | 12/2008 | Itahara et al. | |
| 7,961,045 B2 * | 6/2011 | Morris et al. | 330/149 |
| 8,014,443 B2 * | 9/2011 | Nakamura et al. | 375/232 |
| 8,520,773 B2 | 8/2013 | Bai | |
| 2001/0048346 A1 | 12/2001 | Matsuura et al. | |
| 2012/0082264 A1 | 4/2012 | Shen | |

OTHER PUBLICATIONS

European Patent Application No. 12835935.3, Search Report mailed May 13, 2015.

* cited by examiner

SYSTEMS AND METHODS FOR ADAPTIVE POWER AMPLIFIER LINEARIZATION

CROSS-REFERENCE TO RELATED APPLICATIONS

The present application is a continuation of U.S. patent application Ser. No. 13/633,066, filed Oct. 1, 2012 and entitled "Systems and Methods for Adaptive Power Amplifier Linearization," now U.S. Pat. No. 8,766,718, which claims the benefit of U.S. Provisional Patent Application Ser. No. 61/541,894, filed Sep. 30, 2011 and entitled "Adaptive Power Amplifier Linearization Method and Apparatus with Analog Sampling of Intermodulation Distortion (IMD) for Wideband Wireless Transmission Systems," which are hereby incorporated by reference herein.

BACKGROUND

1. Field of the Invention(s)

The present invention(s) generally relate to power amplification. More particularly, the invention(s) relate to systems and methods for adaptive linearization of power amplification.

2. Description of Related Art

With ever increasing and nearly ubiquitous use of wireless communication services, the demand for backhaul capacity for wireless communication networks is increasing exponentially. A high capacity microwave point-to-point link has low recurring cost and practically no right-of-way issues. Installation can usually be completed in a few weeks once the licensing has been secured. A microwave link essentially consists of a pair of wireless transmitter and receiver, one at each end. One of the most important parameters of such a link is the output power of the transmitter which directly affects the system gain of the link and therefore the size of the antenna that must be used for a given link distance. In a wireless backhaul network, higher output power is almost universally preferred and is only limited by the linear output power that can be obtained from the transmitter while meeting regulatory and power consumption requirements.

An important aspect of microwave radio link design is the efficiency of the power amplifier. Typically, almost 40 to 60% of the total DC budget of a transceiver is consumed by the power amplifier (PA) alone. The efficiency limitation is a result of the requirement that the output power from the PA must be obtained at or below a specified IMD3 level. This is required to both meet the regulatory requirement (such as those specified by FCC in US and ETSI in Europe) and to achieve a specified BER on the receiver side for a given received signal level.

SUMMARY OF THE INVENTION

An exemplary system comprises a linearizer, a power amplifier, and a feedback block. The linearizer may be configured to use a predistortion control signal to add predistortion to a receive signal to generate a predistorted signal. The power amplifier may be configured to amplify power of the predistorted signal to generate a first amplified signal. The power amplifier may also add high side and low side amplifier distortion to the predistorted signal. The high side and low side amplifier distortion may cancel at least a portion of the predistortion. The feedback block may be configured to capture a feedback signal based on a previous amplified signal from the power amplifier, to determine high side and low side distortion of the captured feedback signal, and to generate the predistortion control signal based on the determined high side and low side distortion.

In some embodiments, the feedback block being configured to determine the high side and low side distortion of the captured feedback signal comprises the feedback block being configured to determine a high side distortion of the captured feedback signal and, subsequently, determining a low side distortion of the captured feedback signal. The feedback block being configured to generate the predistortion control signal based on the determined high side and low side distortion may comprise the feedback block being configured to generate the predistortion control signal based on the determined high side distortion and, subsequently, the feedback block configured to generate the predistortion control signal based on the determined low side distortion. The linearizer configured to use the predistortion control signal to add predistortion to the receive signal to generate the predistorted signal may comprise the linearizer being configured to use the predistortion control signal based on the determined high side distortion to add predistortion to the receive signal and, subsequently, the linearizer being configured to use the predistortion control signal based on the determined low side distortion to add predistortion to the receive signal.

The feedback block configured to determine the high side and low side distortion of the captured feedback signal may comprise the feedback block simultaneously or near simultaneously determining a high side distortion and a low side distortion of the captured feedback signal. In some embodiments, the feedback block configured to generate the predistortion control signal based on the determined high side and low side distortion comprises the feedback block configured to generate the predistortion control signal based on both the determined high side distortion and the determined low side distortion. The linearizer configured to use the predistortion control signal to add predistortion to the receive signal to generate the predistorted signal may comprise the linearizer configured to use the predistortion control signal based on the determined high side distortion and the determined low side distortion to add predistortion to the receive signal.

The feedback block configured to generate the predistortion control signal based on the determined high side and low side distortion may comprise the feedback block configured to compare the determined high and low side distortion to at least one reference signal and generating the predistortion control signal based on the comparison.

The system may further comprise a sampling oscillator configured to assist in serially sampling the low side of the feedback signal and the high side of feedback signal. In some embodiments, the system comprises a splitter configured to split the feedback signal, a first oscillator and mixer module configured to assist in sampling the low side of the feedback signal from the splitter, a second oscillator and mixer module configured to assist in sampling the high side of the feedback signal from the splitter, and a combiner to combine samples.

An exemplary method comprises adding predistortion to a receive signal to generate a predistorted signal, the added predistortion being based on a predistortion control signal, amplifying power with a power amplifier of the predistorted signal to generate a first amplified signal, the power amplifier adding high side and low side amplifier distortion to the predistorted signal, the high side and low side amplifier distortion cancelling at least a portion of the predistortion, capturing a feedback signal based on a previous amplified signal from the power amplifier, determining a determine high side and low side distortion of the captured feedback signal, and generating the predistortion control signal based on the determined high side and low side distortion.

Another exemplary system may comprise a linearizer, a power amplifier, a means to capture a feedback signal based on a previous amplified signal from the power amplifier, a means to determine a high side and low side distortion of the captured feedback signal, and a means to generate the predistortion control signal based on the determined high side and low side distortion. The linearizer may be configured to use a predistortion control signal to add predistortion to a receive signal to generate a predistorted signal. The power amplifier may be configured to amplify power of the predistorted signal to generate a first amplified signal. The power amplifier may be configured to add high side and low side amplifier distortion to the predistorted signal, the high side and low side amplifier distortion cancelling at least a portion of the predistortion.

BRIEF DESCRIPTION OF THE DRAWINGS

The drawings are provided for purposes of illustration only and merely depict typical or example embodiments. These drawings are provided to facilitate the reader's understanding and shall not be considered limiting of the breadth, scope, or applicability various embodiments.

The figures are not intended to be exhaustive or to limit the embodiments to the precise form disclosed. It should be understood that various embodiments may be practiced with modification and alteration.

DETAILED DESCRIPTION OF THE INVENTION

Various embodiments described herein a linearizer may add predistortion to a signal to cancel or reduce noise caused by non-linear components. A linearizer may be any circuit, component, or device configured to provide such predistortion to a signal that may cancel, reduce, and/or interfere with noise and/or energy produced by a non-linear component. A non-linear component is any circuit, component, or device that may produce non-linear noise or unwanted energy in a signal.

In various embodiments, a linearizer utilizes a feedback signal sampled from a non-linear device such as a power amplifier. The occupied bandwidth resulting from distortion is the carrier bandwidth multiplied by the intermodulation order. Intermodulation distortion 3 (IMD3) may occupy three times the carrier bandwidth and the IMD5 distortion may occupy five times the carrier bandwidth. In order to cancel the intermodulation distortion (IMD), high speed components, such as clock generator, ADC, and microprocessor, may be used to control the linearizer based on the expanded bandwidth. Unfortunately, high speed components that can process three to five times the carrier bandwidth may increase cost of the circuit but may also increase DC power consumption.

For example, in a digital system, a linearizer or adaptive predistorter may utilize a feedback signal that is two to three times the frequency of the signal to be adjusted. For high frequency signals, the processing power, cost, and DC consumption may be prohibitive. For example, if the signal to be adjusted is 2 GHz, a processor may be required to process a 6-10 GHz feedback signal to control the adjustment.

In order to reduce cost as well as DC power consumption, analog systems and methods may be implemented to linearize the performance of a component, circuit, or device (e.g., a transmitter). In various embodiments, a processor that controls the linearizer may be configured to process the low and/or high side of a feedback spectrum. This information may be used to control the linearizer thereby reducing the cost, workload, and power consumption of the processor. As a result of some embodiments, high speed, high bandwidth components may not be essential.

Figure 1:
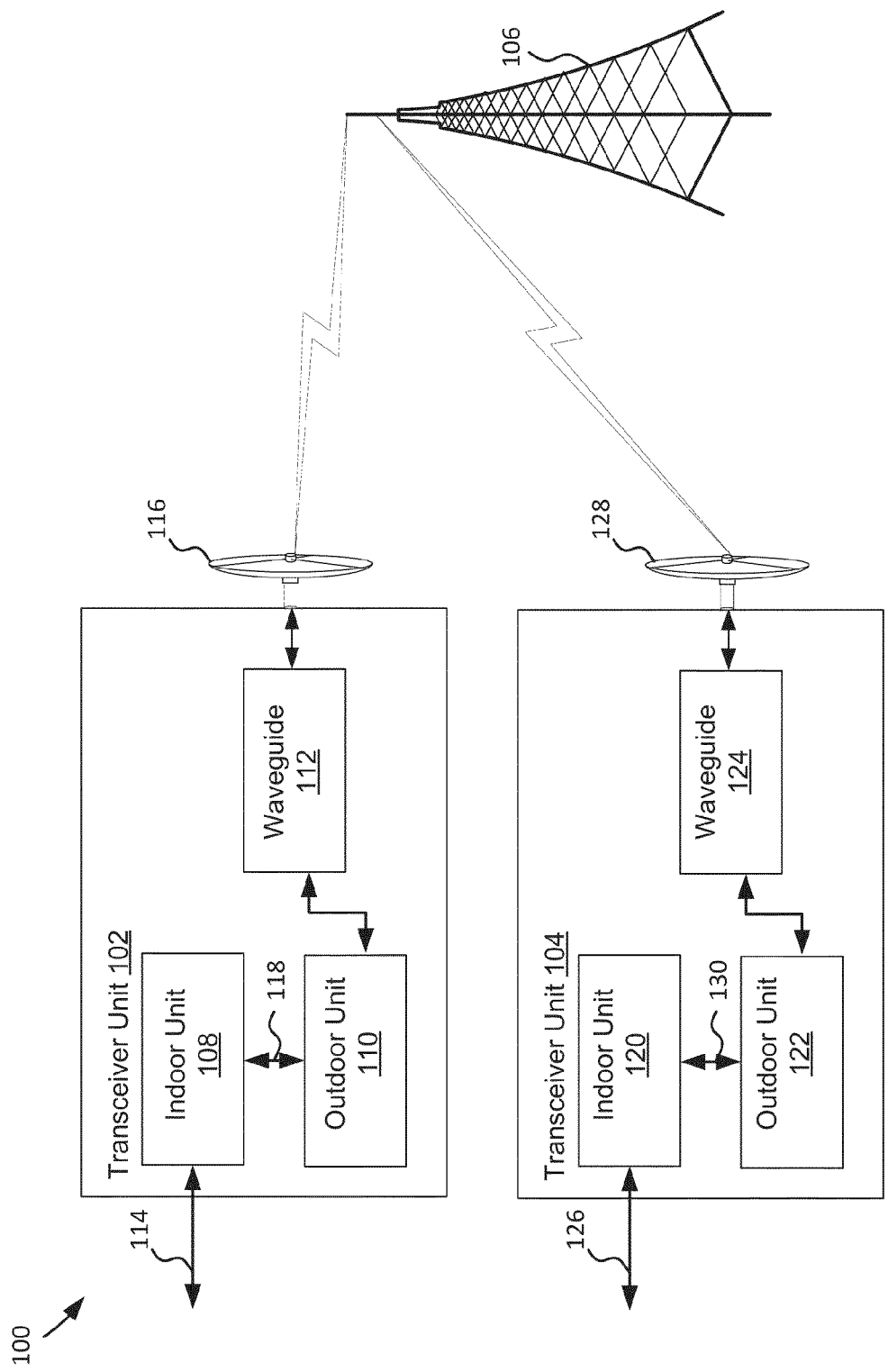
FIG. 1 is an environment including two transceiver units in some embodiments.

FIG. 1 is an environment 100 including two transceiver units 102 and 104 in some embodiments. Each of the transceiver units 102 and 104 are split mount radios. A split-mount radio has a part of the electronics mounted outdoors with an antenna and part indoors. The outdoor unit (ODU) may be the RF transmitter/receiver. In various embodiments, the indoor unit (INU) contains a data access card (DAC) and a radio access card (RAC). The INU may contain the modulator/demodulator, multiplexer, control, and traffic interface elements. The INU and ODU may be coupled together using a cable or any other means.

By comparison, an all-indoor radio has all radio equipment installed inside and is connected to its antenna using a waveguide or coax feeder. A split-mount radio may be a point-to-point radio installation for licensed 6 to 38+ GHz frequency bands with the ODU direct-mounted to the rear of the antenna to provide an integral antenna feed. By having the ODU mounted with the antenna, split-mount may eliminate or reduce feeder losses, minimize or reduce rack occupancy, and/or lower installed costs compared to indoor radios.

For example, transceiver unit 102 may comprise an INU 108 in communication with a processor and/or a digital device, an ODU 110 in communication with the INU 108 over cables 118, a waveguide 112 in communication with the ODU 110, and an antenna 116. The INU 108 may comprise a modulator/demodulator and control circuitry for providing data from a digital device or a processor over line 114 to the antenna 116 via the ODU 110 and/or the waveguide 112. Similarly, the INU 108 may also be configured to receive information from the antenna 116 via the ODU 110 for providing to the digital device or processor via the line 114. The ODU 110 may comprise an RF transmitter/receiver and be coupled with the antenna 116. The waveguide 112 may or may not be a part of the ODU 110.

The INU 108 of the transceiver unit 102 may be coupled to the ODU 110 utilizing a coaxial cable 118. Although only one coaxial cable 118 is depicted in FIG. 1, any number of coaxial cables may provide signals between the INU 108 and the ODU 110. Further, those skilled in the art will appreciate that any number and/or type of cables may be configured to receive and transmit signals between the INU 108 and the ODU 110.

Similarly, transceiver unit 104 may comprise an INU 120 in communication with a processor and/or a digital device, an ODU 122 in communication with the INU 120 over cable 130, a waveguide 124 in communication with the ODU 122, and an antenna 128. The INU 120 may comprise a modulator/ demodulator and control circuitry for providing data from a digital device or a processor over line 126 to the antenna 128 via the ODU 122 and/or the waveguide 124. Similarly, the INU 120 may also be configured to receive information from the antenna 128 via the ODU 122 for providing to the digital device or processor via the line 126. The ODU 122 may comprise an RF transmitter/receiver and be coupled with the antenna 128. The waveguide 124 may or may not be a part of the ODU 122.

The INU 120 of the transceiver unit 104 may be coupled to the ODU 122 utilizing a coaxial cable 130. Although only one coaxial cable 130 is depicted in FIG. 1, any number of coaxial cables may provide signals between the INU 108 and the ODU 110. Further, those skilled in the art will appreciate that any number and/or type of cables may be configured to receive and transmit signals between the INU 108 and the ODU 110.

Those skilled in the art will appreciate that the transceiver unit 104 may perform in a manner similar to the transceiver 102. In various embodiments, the two transceiver units 102 and 104 may be in communication with each other over a wireless communication tower 106. Those skilled in the art will appreciate that the transceiver units 102 and 104, individually or together, may communicate with any digital device or receiver.

The wireless communication tower 106 (e.g., cell tower or other microwave radio device) may be any device configured to receive and/or transmit wireless information.

Figure 2:
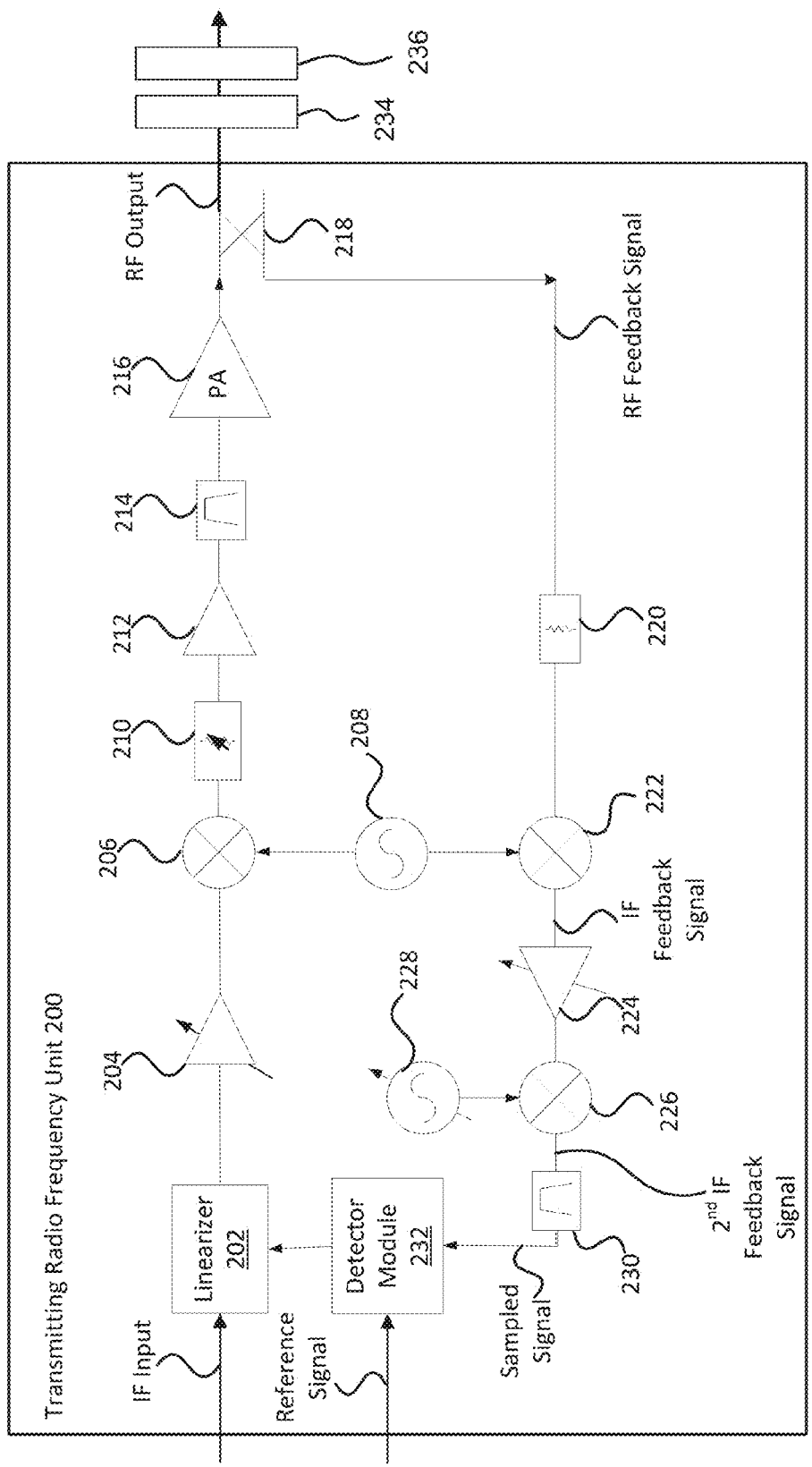
FIG. 2 is a block diagram of an exemplary transmitting radio frequency unit in some embodiments.

FIG. 2 is a block diagram of an exemplary transmitting radio frequency unit 200 in some embodiments. In some embodiments, the power amplifier 216 is integrated into the transmitting radio frequency unit 200 (e.g., a functioning microwave radio) as a final stage power amplifier. In various embodiments, the detector module 232 compares a reference signal and/or the IF input signal with high and/or low side signal samples of a feedback signal. The feedback signal may be a down-converted replica of an amplified signal at the output of the transmitter 200.

The transmitting radio frequency unit 200 may be any transmitter including, but not limited to, a heterodyne transmitter with a TX intermediate frequency (IF) output. The transmitting radio frequency unit 200 may comprise a linearizer 202, a gain adjuster 204, a mixer module 206, an oscillation module 208, a gain adjuster 210, a driver 212, a filter module 214, a power amplifier 216, a coupler 218, a gain adjuster 220, a mixer module 222, a gain adjuster 224, a sampling mixer module 226, a sampling oscillator 228, a sampling filter 230, and a detector module 232. The transmitting radio frequency unit 200 may be coupled to a waveguide filter 234 and a waveguide 236. The transmitting radio frequency unit 200 may also be coupled (via the waveguide filter 234 and the waveguide 236) to an antenna (such as a parabolic antenna for microwave communications).

The gain adjuster module 204 may comprise an automatic gain control (AGC) circuit or other gain adjuster configured to increase or decrease the gain of the IF input signal from the linearizer 202. Similarly, the gain adjuster modules 210, 220 and 224 may comprise an AGC circuit or other gain adjuster.

The gain adjuster 204 may, in some embodiments, adjust the level of the IF input signal for the upconverter (i.e., mixer module 206 and oscillator module 208). Similarly, the gain adjuster 210 may adjust the level for the power amplifier 216, and the gain adjuster 220 may adjust the level of the feedback signal from the converter 218 for the downconverter (i.e., mixer module 222 and oscillator module 208). Further, the gain adjuster module 224 may be configured to adjust the level of the IF feedback signal from the downconverter to sample the signal with the sampling converter (i.e., mixer module 226 and sampling oscillator 228).

In some embodiments, the gain adjuster 220 is an attenuator such as a fixed attenuator. In various embodiments, one or more of the gain adjusters may be attenuators.

The gain adjuster 204, 210, 220 and/or 224 may comprise many different types of AGCs with many different electrical properties. The AGC module 204, 210, 220 and/or 224 may each include one or more components. In some embodiments, the gain adjuster 220 and/or 224 may adjust the gain of signals to be within an operating range or preferred operating range of the linearizer 202 and/or the detector module 232.

The linearizer 202 may receive the IF input signal (e.g., a receive signal) and one or more predistorter control signals from the detector module 232. In various embodiments, the detector module 232 inversely models gain and phase characteristics and produces a predistortion control signal. The linearizer 202 may receive the predistortion control signal and, based on the predistortion control signal, reduce distortion and increase linearity of the signal that is to be provided to the antenna. In various embodiments, the linearizer 202 may produce a signal that will reduce distortion caused by the power amplifier 216. For example, the linearizer 202 may introduce "inverse distortion" into the signal to cancel non-linearity which may be caused by one or more components (e.g., such as the power amplifier 216).

The detector module 232 may comprise a processor. In some embodiments, the detector module 232 compares the feedback signal (e.g., $2^{nd}$ IF feedback signal) received from the filter module 230 to a reference signal to detect distortion in the feedback signal. If the feedback signal contains distortion, the detector module 232 may configure the linearizer 202 to introduce "inverse distortion" to cancel non-linear distortion that may be added by other components of the transmitting radio frequency unit 200. In one example, the predistortion control signal configures the linearizer 202 to control an amount of distortion introduced into the output signal. In some embodiments, the reference signal represents a desired signal with little to know distortion caused by a nonlinear component.

In some embodiments, the detector module 232 may compare the IF input signal to the sampled feedback signal to determine if there is distortion in the sampled feedback signal. The detector module 232 may make a determination that inverse distortion should be added to the intermediate output signal if detected distortion is greater than a predetermined threshold of distortion. In one example, the detector module 232 may tolerate a limited amount of distortion in the feedback signal before increasing or decreasing inverse distortion. In some embodiments, the distortion threshold may be set by a digital device (e.g., controlled by an administrator or user). A digital device may be any device with memory and a processor.

Those skilled in the art will appreciate that distortion introduced by the power amplifier 216 may be cancelled by predistortion or postdistortion (i.e., adding inverse distortion that cancels distortion added in the signal by other components). Further, one or more components may be selected and included in the circuit that, among other functions, may increase predistortion which may cancel the distortion added by other components, such as the power amplifier 216.

Those skilled in the art will appreciate that, in some embodiments, rather than being at the beginning of the circuit, the linearizer may be configured to add inverse distortion to the signal that was amplified by the power amplifier.

The mixer module 206 and the oscillator module (RFLO) 208 may represent an upconverter configured to upconvert the adjusted output signal from the gain adjuster 204 to generate an RF signal. The upconverted RF signal may be at the radio frequency (RF) that is output by an antenna.

Similarly, the mixer module 222 and oscillator module 208 may represent a downconverter configured to downconvert a sampled signal from the coupler 218 from the radio frequency to the intermediate frequency to generate the IF feedback signal. Those skilled in the art will appreciate that there may be any number of upconverters or downconverters configured to upconvert and/or downconvert the signals within the transmitting radio frequency unit 200.

In some embodiments, the mixer module 206 mixes a signal received from the gain adjuster 204 with the oscillating signal from the oscillator module 208. The mixer module 222 may mix the signal received from the gain adjuster 220 with the oscillating signal from the oscillator module 208. In various embodiments, the oscillator module 208 is coupled to a splitter that splits the oscillation signal from the oscillator module 208 to the mixer module 206 and the mixer module 222. In some embodiments, there may be separate oscillator modules coupled to each mixer module 206 and 222, individually. Those skilled in the art will appreciate that, in some embodiments, there may be multiple oscillator modules that each provide an oscillating signal to the mixer module 206 and the mixer module 222, respectively The sampling mixer 226 may be coupled to the sampling oscillator 228 in the feedback path. The sampling mixer 226, sampling oscillator 228, and sampling filter 230 may provide samples of the low sideband and high sideband of the spectrum from the coupler 218. The detector module 232 may determine an amount of predistortion that should be added to the IF input signal based on the one or both sideband samples.

The mixer modules 206, 222, and 226 may comprise many different types of mixers with many different electrical properties. Further, each mixer modules 206, 222, and 226 may include one or more components. For example, the mixer module 206 may comprise one or more mixers.

The oscillator module 208 may provide an oscillating signal that may be used to upconvert and/or downconvert a signal. The oscillator module 208 may comprise any kind of oscillator with any different electrical properties. In one example, the oscillator module 208 provides an oscillating signal to the mixer module 206 and the mixer module.

The oscillator module 208 and/or 228 may be local or remote. In one example, the oscillator module 208 may be remotely located and configured to provide an oscillating signal to one or more transmitting radio frequency units. The oscillator module 208 and/or 228 may include one or more components. For example, the oscillator module 208 may comprise one or more oscillators.

The driver 212 may be any amplifier and/or attenuator. In one example, the driver comprises one or more GaAs IMFETs. In some embodiments, the driver 212 may receive the adjusted signal from the gain adjuster 210 and amplify the adjusted signal. Alternately, the driver 212 may receive a filtered signal from the filter module 214 and amplify or attenuate the signal. The driver 212 may provide the signal to the power amplifier 216. In some embodiments, the driver 212 is optional.

Those skilled in the art will appreciate that the driver 212 may comprise or be replaced by an amplification/attenuation module. The amplification/attenuation module may comprise an amplifier and/or an attenuator configured to amplify and/or attenuate a signal. The amplification/attenuator module may be any kind of amplifier and/or attenuator. Further, the amplification/attenuator module may comprise one or more amplifiers and/or attenuators with any kind of electrical properties.

The filter modules 214 and 230 may be any type of filter configured to filter signals. In one example, the filter module 214 may be bandpass filter configured to filter the signal received from the driver 212. In some embodiments, the upconverter and downconverter may comprise one or more filter modules configured to filter one or more signals.

The filter modules 214 and 230 may comprise many different types of filters (e.g., bandpass filter, low pass filter, high pass filter, saw filter, or the like) with many different electrical properties. Filter modules 214 and 230 may comprise the same, similar, or different filters. Further, filters modules 214 and 230 may comprise filters of a similar type but have different electrical properties. Each filter modules 214 and 230 may include one or more components. For example, the filter module 214 may comprise one or more filters.

The power amplifier 216 amplifies the power of the signal received from the driver 212. In some embodiments, the amplified signal may then be provided to a waveguide filter 234, waveguide 236, and/or antenna (not depicted) for transmission at the improved power.

The power amplifier 216 may be integrated into a functioning microwave radio (e.g., transmitting radio frequency unit 200) as the final stage power amplifier. In some embodiments, the power amplifier comprises a GaN device which may be used as or within a power amplifier. In one example, a 15 W gallium nitride (GaN) high electron mobility transistor (HEMT) designed specifically for high efficiency, high gain and wide bandwidth capabilities may be utilized.

Although a single power amplifier 216 is depicted in FIG. 2, those skilled in the art will appreciate that there may be any number of power amplifiers 216. For example, multiple GaN power amplifiers 216 may be a part of a matching network.

Further, those skilled in the art will appreciate that use of the power amplifier 216 over alternatives may lead to high transmitter power at the same or lower DC power consumption. Moreover, combining the power amplifier 216 with the linearizer 202 may lead to improved linearity and same power out or same linearity at higher power out. In some embodiments, power amplifier DC power efficiency may be improved. In various embodiments, the combination of the power amplifier 216 and the 208 and/or 228 202 may lead to an increase of the overall yield by lowering the junction temperature of the power amplifier for the same power out. Further, a broadband, high-efficiency power amplifier may be designed with a reduced number of transmitter options.

In some embodiments, the transmitting radio frequency unit 200 may comprise or communicate with the waveguide filter 234 and the waveguide 236. The waveguide filter 234 may be any filter coupled to the waveguide 236 and configured to filter the electromagnetic waves (e.g., remove noise). The waveguide 236 may provide the signal to one or more antennas. The waveguide 236 may be any waveguide kind or type of waveguide. For example, the waveguide 236 may be hollow and/or comprise a dielectric. In some embodiments, the waveguide 236 comprises a rectangular to circular waveguide.

In various embodiments, a feedback path provides a replica of the amplified signal from the power amplifier 216 back to the linearizer 202. The feedback path may comprise the coupler 218, the gain adjuster 220, the mixer module 222, the gain adjuster 224, the sampling mixer module 226, the sampling oscillation module 228, the sampler filter module 230, and the detector module 232.

The coupler 218 is any type of component configured to sample or split the amplified signal from the power amplifier 216. In some embodiments, the coupler 218 samples the amplified signal to create the feedback signal The feedback signal may be provided to the gain adjuster 220 which may increase or decrease the gain of the feedback signal. In one example, the gain adjuster 220 decreases the gain of the feedback signal from the coupler 218 to be within a preferred operating range of the mixer module 222. The coupler 218 may be a directional coupler.

In various embodiments, the high side band and low side band of the feedback signal may be sampled and compared to an expected threshold (e.g., compared to a reference signal or the IF input signal). The high side band of the feedback signal may be termed the high-side IMD and the low side of the feedback signal may be termed low-side IMD. Predistortion control signals may be generated based on the comparison. Differences between the high side band and/or low side band differ with the reference signal and/or the IF input signal may indicate distortion which may be reduced by the linearizer 202. For example, the linearizer 202 may input predistortion into the IF input signal to interfere, cancel, or otherwise reduce noise produced by one or more components (e.g., power amplifier 216) of the transmitter 200.

In some embodiments, the main signal (e.g., middle band) of the feedback signal may also be sampled. The detector module 232 may be configured to compare the high side band and the low side band against each other, against the middle band, against he IF input signal, and/or against the reference signal. The detector module 232 may be configured to control the linearizer 202 based on the comparison(s).

The sampling oscillator module 228 and sampling mixer module 226 may allow for and/or assist in serial sampling of the IF feedback signal from the gain adjuster module 224 and/or the downconverter of the feedback path. As a result, the $2^{nd}$ IF feedback signal may comprise a plurality of signals, each of the signals containing a sample of either the low side or high side of the IF feedback signal.

The sampling filter module 230 may be a saw filter or any other filter that will allow the detector 232 to receive each of the low side and high side samples. In some embodiments, the frequency of the $2^{nd}$ IF feedback signal may be aligned to allow the IM distortion components pass through sampling filter 230.

In some embodiments, the detector module 232 may compare the low side band sample of the $2^{nd}$ IF feedback signal to a reference signal and/or IF input to detect distortion (or distortion that is greater than a predetermined threshold). If distortion is found in the feedback signal based on the comparison, the detector 232 may control the linearizer 202 (e.g., with predistortion control signals) to input predistortion in the IF input to cancel the undesired portions of the signal.

Similarly, the detector module 232 may compare the high side band sample of the $2^{nd}$ IF feedback signal to a reference signal and/or IF input to detect distortion (or distortion that is greater than a predetermined threshold). If distortion is found in the feedback signal based on the comparison, the detector 232 may control the linearizer 202 (e.g., with predistortion control signals) to input distortion in the IF input to cancel the undesired portions of the signal. In some embodiments, the detector module 232 compares the low side band sample and/or the high side band sample to each other and/or a main signal sample. The detector module 232 may generate the predistortion control signal based on a comparison of the low side band, high side band, and/or main signal sample with the reference signal and/or the IF input signal. Further, the detector module 232 may generate the predistortion control signal based also on comparisons among the low side band, high side band, and/or the main signal sample.

In various embodiments, the detector module 232 may receive a sample of one side band and control the linearizer 202 to input predistortion into the IF input signal to correct only for distortion detected in the one side band or for the distortion assuming that the one side band represents distortion in the other side band (e.g., the low side band distortion represents high side band distortion).

It will be appreciated that a "module" may comprise software, hardware, firmware, and/or circuitry. In one example, one or more software programs comprising instructions capable of being executable by a processor may perform one or more of the functions of the modules described herein. In another example, circuitry may perform the same or similar functions. Alternative embodiments may comprise more, less, or functionally equivalent modules and still be within the scope of present embodiments. For example, as previously discussed, the functions of the various modules may be combined or divided differently.

In various embodiments, those skilled in the art will appreciate that multiple transmitting radio frequency units may be used to transmit the same signal (e.g., signals containing the same information provided by a wireless communication source). Each transmitting radio frequency unit may adjust the phase of the signal to be transmitted, respectively, based on the same predetermined phase value. Similarly, each transmitting radio frequency unit may adjust the gain of the signal to be transmitted, respectively, based on the same gain value. As a result, the phase and gain of the signal from each transmitting radio frequency unit may be the same or substantially similar (e.g., the phase and gain of the signals may be identical). The signals may be subsequently combined to strengthen the signal. In one example, the signals are combined prior to transmission over the antenna. In another example, the signals are transmitted over different antennas and the signals spatially combine. U.S. nonprovisional patent application Ser. No. 13/249,202, entitled "Systems and Methods for Providing Signals of Multiple Active Wireless Transmitters," filed Sep. 29, 2011, is incorporated herein by reference.

Towards that end, the transmitting radio frequency unit 200 may further comprise a signal quality control module configured to generate a phase control signal to control a phase of a processed signal. The signal quality control module may receive the upconverted signal (e.g., the signal after upconversion by the mixer module 206) and mix the received signal with a local oscillator signal (e.g., from oscillator module 208). The signal quality control module may filter and/or compare the mixed signal with a predetermined phase value to generate a phase control signal based on the comparison. The phase control signal may control a phase adjuster which adjusts the phase of the signal within the transmitting radio frequency unit 200. In some examples, the phase adjuster adjusts the signal before or after the signal is upconverted by the mixer module 206.

In some embodiments, the signal quality control module may comprise a splitter to split the signal (e.g., amplified signal) between the phase comparator and a gain comparator. The phase comparator may generate the phase control signal based on a comparison of the phase of the mixed signal with a predetermined phase value. The gain comparator may generate the gain control signal based on a comparison of the gain of the split signal with a predetermined gain value. The gain control signal may control a gain adjuster (e.g., AGC module). In some embodiments, the transmitting radio frequency unit 200 comprises a gain adjuster configured to receive the signal before or after the mixer module 206 upconverts the signal.

The phase adjuster may comprise a variable phase control circuit configured to increase or decrease the phase of the signal to be transmitted. The phase adjuster may comprise any type of phase adjuster or phase shifter with different electrical properties. The phase adjuster may adjust the phase of the signal based on the phase control signal from the signal quality control module. The phase adjuster may include one or more components. For example, the phase adjuster may comprise one or more phase control elements.

Figure 3:
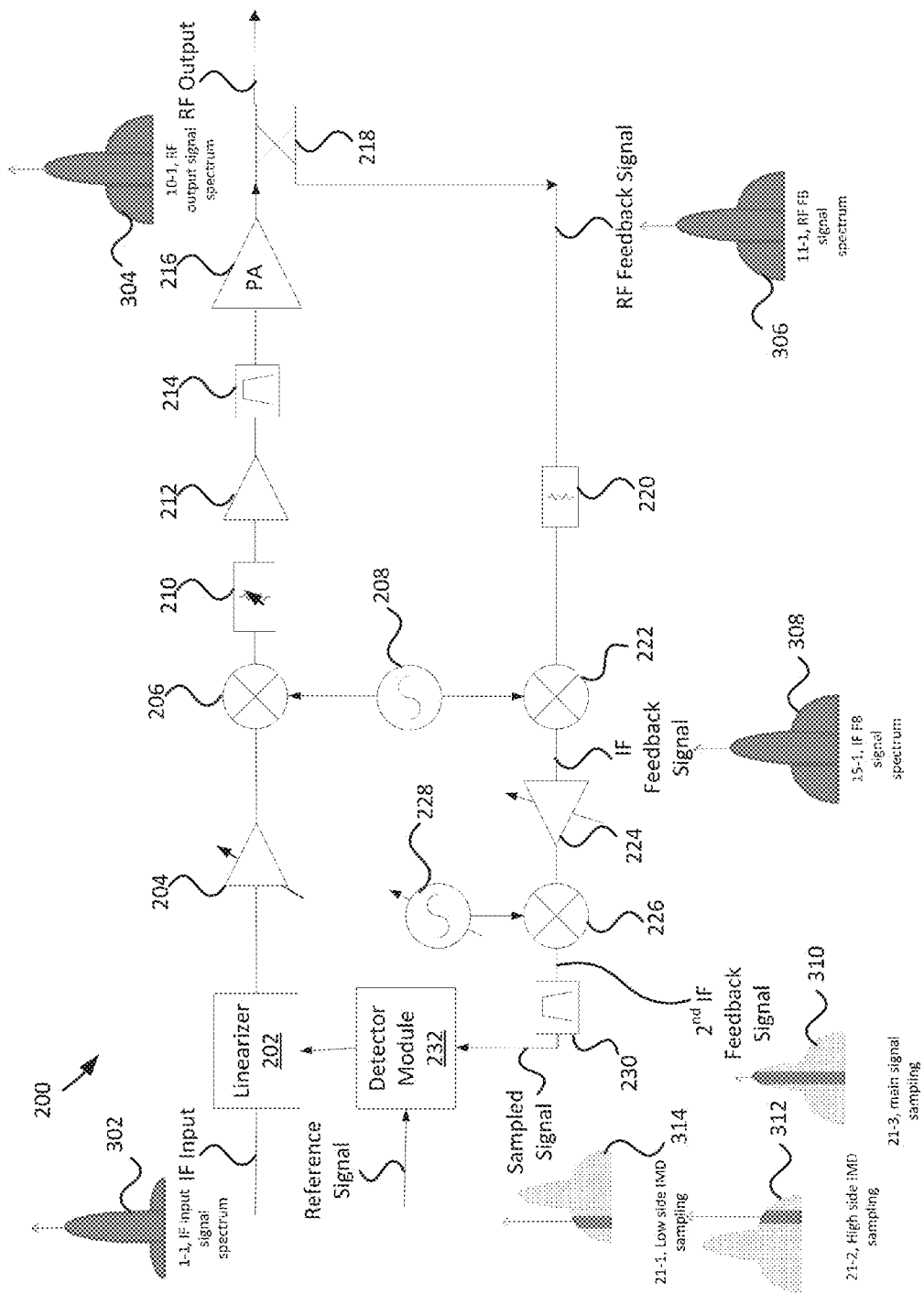
FIG. 3 is another block diagram of an exemplary transmitting radio frequency unit depicting the sampling of the signal in some embodiments.

FIG. 3 is another block diagram of an exemplary transmitting radio frequency unit 200 depicting the sampling of the signal in some embodiments. Waveform 302 is the spectrum of the IF input signal that may be received by the linearizer 202 as the IF input signal (e.g., the receive signal). The waveform 302 indicates that the waveform is of an intermediate frequency. The side lobes (i.e., side bands) of the waveform 302 are low. The waveform 304, however, has larger side lobes than the wave form 302. The greater side lobes may be as a result of noise added to the signal by the nonlinear power amplifier 216 and/or other components.

The RF signal may be sampled by the coupler 218 to form a RF feedback signal represented by waveform 306. The RF feedback signal from the gain adjuster 220 may be downconverted to form the IF feedback signal represented by waveform 308.

The sampling mixer 226, sampling oscillator 228, and/or sampling filter 230 may assist in sampling the IF feedback signal at any point. In one example, the sampling mixer 226 and sampling oscillator 228 may assist in sampling the main signal of the waveform (represented by waveform 310). The sampling mixer 226 and sampling oscillator 228 may assist in sampling the high side lobe represented by waveform 312. Further, the sampling mixer 226 and sampling oscillator 228 may assist in sampling the low side lobe represented by waveform 314. The samples may be provided to the detector module 232.

As discussed herein, the detector module 232 may control the linearizer 202 to add predistortion within the IF input signal such that the predistortion may cancel, reduce, and/or interfere with noise cause by one or more components of the transmitter 200, such as the nonlinear effects added to the signal by the power amplifier 216.

In various embodiments, the sampling mixer 226 and sampling oscillator 228 and/or the sampling filter 230 may sample the IF feedback signal at different points of the waveform. In one example, the sampling mixer 226 and sampling oscillator 228 sample one portion of the waveform at a time. In this example, the sampling mixer 226 and sampling oscillator 228 may sample the main signal of the waveform and provide the information to the detector module 232. Subsequently, the sampling mixer 226 and sampling oscillator 228 may sample the high side lobe and provide the information to the detector module 232. Finally the sampling mixer 226 and sampling oscillator 228 may sample the low side lobe and provide the information to the detector module 232. In this example, however, the linearizer 202 may be configured to react to only one portion of the waveform for any given adjustment. As a result, the linearizer 202 may be configured to reduce distortion in the main signal and not perform an adjustment based on the side lobes. Subsequently, the linearizer 202 may be configured to reduce distortion in the high side lobe and assume that similar distortion may be found in the low side lobe. Further, the linearizer 202 may be configured to reduce distortion in the low side lobe and assume that similar distortion may be found in the high side lobe In some embodiments, the linearizer 202 may be configured to, serially, at any given time, reduce only a portion of the distortion cause by the power amplifier In various embodiments, there may be any number of carrier signals that may be processed by the transmitting radio frequency unit 200. The sampling oscillator 228 may be configured to assist in sampling distortion at any point of the spectrum in order to assist the detector module 232 to detect distortion that may be reduced or eliminated. For example, the linearizer may be configured to add predistortion to reduce distortion in a system with any number of IF input signals or carrier signals.

Figure 4:
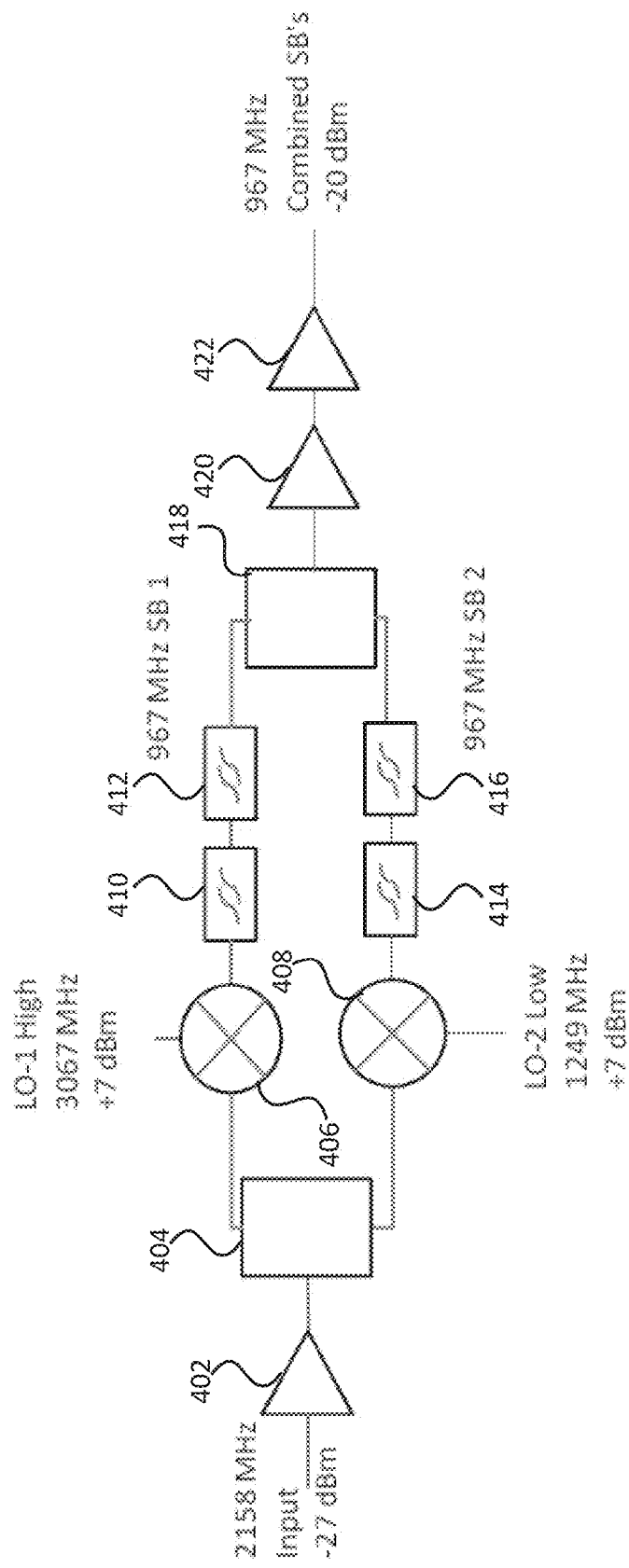
FIG. 4 is another sampling feedback path in some embodiments.

FIG. 4 is another sampling feedback path 400 in some embodiments. The feedback path 400 may comprise a gain adjuster 402, a splitter 404, a high side mixer 406, a low side mixer 408, filter modules 410, 412, 414, and 416, combiner 418, and gain adjusters 420 and 422. The feedback path 400 may allow the high side and low side bands of the feedback signal (e.g., of the IF feedback signal) to be sampled simultaneously or near-simultaneously. The detector module 232 may compare both the high and low side lobe samples to a reference signal and/or IF input signal to generate a predistorter control signal. As a result, the linearizer 202 may add predistortion to the IF input signal based on detected distortion in both high and low side bands.

In various embodiments, the feedback path 400 replaces the gain adjuster 224, sampling mixer 226, sampling oscillator module 228, and sampling filter 230 of FIG. 2. For example, the gain adjuster module 220 may receive the RF feedback signal from the coupler 218. The downconverter (i.e., mixer module 222 and oscillator module 208) may downconvert the gain adjusted RF feedback signal to an intermediate frequency to generate the IF feedback signal. The gain adjuster 402 may receive the IF feedback signal and adjust levels of the signal. The splitter 404 may split the IF feedback signal onto two separate paths. The low side of the first IF feedback signal (i.e., low side band of the carrier signal) from the splitter 404 may be sampled by the mixer module 406 (e.g., utilizing an oscillator module or the like) and filtered by filter modules 410 and 412. Similarly, the high side of the second IF feedback signal (i.e., high side band of the carrier signal) from the splitter 404 may be sampled by the mixer module 408 (e.g., utilizing an oscillator module or the like) and filtered by filter modules 414 and 416. The combiner 418 may combine the two side samples. Gain adjusters 420 and 422 may adjust the gain (e.g., levels) of the combined samples and provide the combined samples to the detector module 232.

The gain adjusters 402, 410, and 422 may comprise any gain adjusters or AGCs. In various embodiments, the gain adjuster 402 may increase or decrease the gain of the IF feedback signal received from the downconverter. In some embodiments, the gain adjuster 402 may adjust the gain of the intermediate output signal to be with in the operating range or preferred operating range of the transmitter of the mixer module 406, mixer module 408, filter modules 410, 412, 414, and 416, and/or the detect module 232. Similarly, the gain adjuster 420 and/or the gain adjuster 422 may increase or decrease the gain of the amplified signal received from the combiner module 418. In some embodiments, the gain adjuster 420 and/or the gain adjuster 422 may adjust the gain of the combined signal to be with in the operating range or preferred operating range of the detector module 232 and/or the linearizer 202.

The gain adjusters 402, 410, and 422 may each comprise many different types of gain adjusters with many different electrical properties. The gain adjuster 402, 410, and 422 may include one or more components.

The splitter 404 may be any circuit, component, or device that is configured to split a signal to two separate paths. In some embodiments, the splitter 404 is configured to split the signal from the gain adjuster 404 to a first path and a second path. The first path may be electrically coupled with the mixer module 406. The second path may be electrically coupled with the mixer module 408.

The mixer module 406 may be coupled to an oscillator module (not depicted). The mixer module 406 may sample the signal from the splitter to sample the high side band which may be filtered by the filters 410 and 412. Similarly, the mixer module 408 may be coupled to an oscillator module (not depicted). The mixer module 408 may sample the signal from the splitter 404 to sample the low side band which is filtered by the filters 414 and 416.

Those skilled in the art will appreciate that, in some embodiments, there may be multiple oscillator modules that each provide an oscillating signal to the mixer module 406 and the mixer module 408, respectively The mixer modules 406 and 408 may comprise many different types of mixers with many different electrical properties. Further, each mixer modules 406 and 408 may include one or more components. For example, the mixer module 406 may comprise one or more mixers.

One or more oscillator module may provide an oscillating signal that may be used to sample the high side lobe and low side lobe of the feedback signal from the splitter 404. The oscillator module(s) may be local or remote. The oscillator module(s) may include one or more components.

In various embodiments, the oscillators may be configured or controlled by software such that different samples of one or more carrier signals may be taken. For example, the software may configure a processor of a digital device to adjust the timing or output signal of the oscillator.

The filter modules 410, 412, 414, and 416 may be any type of filter configured to filter signals. In one example, the filter module 410 may be saw filter configured to filter the signal received from the mixer module 406. The filter modules 410, 412, 414, and 416 may comprise many different types of filters (e.g., bandpass filter, low pass filter, high pass filter, saw filter, or the like) with many different electrical properties. Filter modules 410 and 414 may comprise the same, similar, or different filters. Further, filters modules 412 and 416 may comprise filters of a similar type but have different electrical properties. Each filter modules 410, 412, 414, and 416 may include one or more components.

The combiner 418 may be any circuit, component, or device configured to combine two or more signals. The combiner 418 may be active or passive.

In one example of the feedback path 400, the gain adjuster 402 receives an IF feedback signal from the downconverter. The IF feedback signal may be at 2,158 MHz with −27 dBm. The mixer module 406 may assist in sampling the signal at the high side band at 3067 MHz with +7 dBm. The mixer module 408 may assist in sampling the signal at the low side band at 1249 MHz with +7 dBm. The filter modules 410, 412, 414, and 416 may be saw filters or any kind of filters. The filter modules 410 and 412 may filter the high side band samples and the filter modules 414 and 416 may filter the low side band samples. The signals from the filters may be at 967 MHz. As a result and as follows, the output from the gain adjusters 420 and 422 may also be at 967 MHz with −20 dBm.

Although FIG. 4 depicts two separate paths to sample the low side and high side sidelobes, those skilled in the art will appreciate that there may be any number of paths to sample a carrier wave at any point and/or multiple points.

Figure 5:
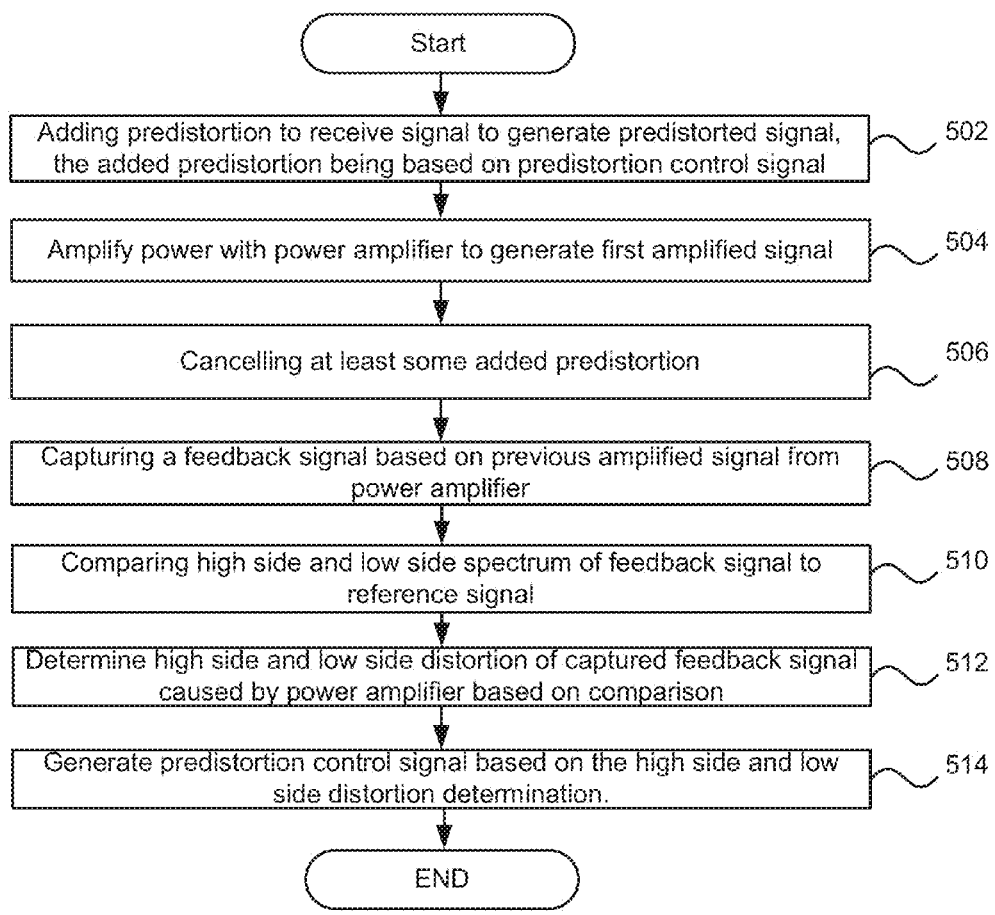
FIG. 5 is a flowchart of a method for linearizing a nonlinear component in some embodiments.

FIG. 5 is a flowchart of a method for linearizing a nonlinear component in some embodiments. In step 502, the linearizer 202 of a transmitting RF unit 200 adds predistortion to a receive signal. The receive signal may be any signal. In some embodiments, the receive signal is an intermediate frequency signal. In various embodiments, the receive signal is an RF signal or a baseband signal. The receive signal may be any frequency. Further, the linearizer 202 may be a part of any circuitry and not limited to a transmitting RF unit 200.

The linearizer 202 may generate add predistortion based on a predistortion control signal received from the detector module 232.

In step 504, a power amplifier 216 amplifies power of the predistorted signal to generate the first amplified signal. The first amplified signal may contain distortion such as low side band and/or high side band distortion. Those skilled in the art will appreciate that the power amplifier 216 is not necessary in various embodiments. For example, in some embodiments, one or more nonlinear circuits, components, or devices may process the predistorted signal and add distortion to the processed signal.

In step 506, at least some of the predistortion added by the linearizer 202 may be cancelled by the distortion or noise provided by the nonlinear circuits, components, or devices (e.g., added by the power amplifier 216). In one example, the predistortion added by the linearizer 202 may destructively interfere with noise or distortion later added by one or more components. As a result, the overall distortion of the signal may be reduced.

In step 508, a coupler 218 captures a feedback signal based on previous amplified signal from the power amplifier 216. For example, prior to the addition of predistortion by the linearizer 202 at a certain time, the coupler 218 may capture the feedback signal. The feedback signal may be processed to detect residual distortion or noise that was not previously cancelled or reduced by previous injections of predistortion. In some embodiments, the feedback signal may be used to detect the efficiency or effectiveness of the linearizer 202 in reducing distortion and/or noise caused by one or more components.

Those skilled in the art will appreciate that, as discussed previously, the power amplifier 216 is not necessary. For example, the coupler 218 may capture a feedback signal based on any previous signal affected by one or more nonlinear circuits, components, or devices.

In step 510, the detector module 232 compares a high side and low side spectrum of the feedback signal to a reference signal. In various embodiments, the feedback signal may be downconverted and adjusted to allow for cheaper and/or slower components to process the feedback signal. In some embodiments, the low side and high side of the feedback signal is sampled (e.g., via sampling feedback path as depicted in FIG. 2-4).

The detector module 232 may compare the high side and/or low side spectrum of the feedback signal to a reference signal to detect distortion added by one or more circuits, components, or devices that was not previously reduced or cancelled. The reference signal may be an IF input signal, receive signal, or any signal received by the linearizer 202.

In some embodiments, the detector module 232 may assume that detected distortion in one side band will be found in the other side band and control the linearizer 202 based on the assumption (e.g., instruct the linearizer 202 to add sufficient predistortion assuming that the distortion in the low side band of the feedback signal is also present in the high side band of the feedback signal). In various embodiments, the detector module 232 may receive samples of both the high side and low side bands simultaneously or near simultaneously. In this example the detector module 232 may control the linearizer 202 based on the combined samples.

In step 512, the detector module 232 detects high side and low side distortion of the captured feedback signal caused by the power amplifier 216 based on the comparison. In some embodiments, the detector module 232 detects high side and/or low side distortion by comparing the side band samples to each other and/or either side band sample to a main signal spectrum sample. Those skilled in the art will appreciate that the detector module 232 may base the detection of distortion on comparisons of the samples to each other as well as comparisons of one or more samples with the reference signal.

In step 514, the detector module 232 may generate the predistortion control signal based on the high side and/or low side distortion determination. The detector module 232, in some embodiments, may generate the predistortion control signal based on either the high side distortion determination or the low side distortion determination. In one example, the detector module 232 generates the predistortion control signal based on the most recently gathered side sample (e.g., either the high side or low side band determination). In various embodiments, the detector module 232 may receive both the high side and/or low side samples simultaneously or near simultaneously (e.g., the samples of the two side bands may be combined). In this example, the detector module 232 may generate the predistortion control signal based on both the high side and low side distortion determination.

The predistortion control signal generated in step 514 may control the linearizer to add predistortion with regard to step 502. Those skilled in the art will appreciate that the process may repeat to improve the effectiveness of the linearizer 202 to reduce nonlinear distortion added by any number of nonlinear circuits, components, or devices.

In some embodiments, the detector module 232 may control the linearizer 202 to add predistortion if the detected predistortion is greater than a predetermined threshold. The predetermined threshold may be established or configured by a digital device (e.g., programmed).

Figure 6:
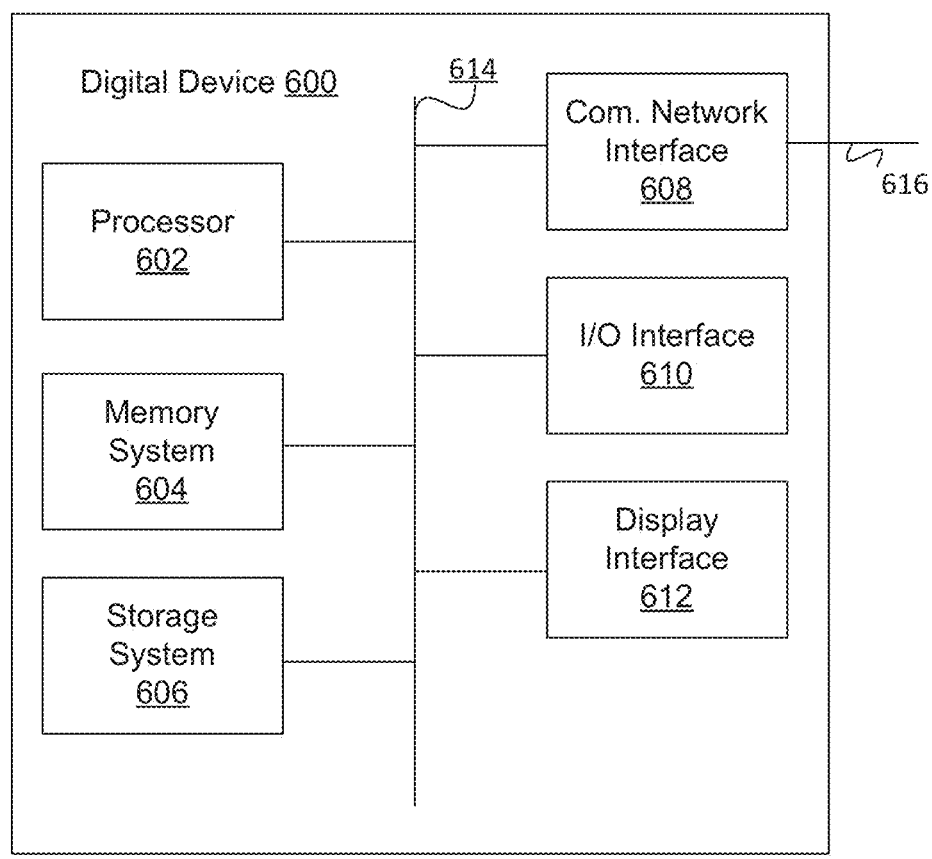
FIG. 6 is a block diagram illustrating an example of a digital device that may be utilized by some embodiments.

FIG. 6 is a block diagram of an exemplary digital device 600. The digital device 600 comprises a processor 602, a memory system 604, a storage system 606, a communication network interface 608, an I/O interface 610, and a display interface 612 communicatively coupled to a bus 614. The processor 602 may be configured to execute executable instructions (e.g., programs). In some embodiments, the processor 602 comprises circuitry or any processor capable of processing the executable instructions.

The memory system 604 is any memory configured to store data. Some examples of the memory system 604 are storage devices, such as RAM or ROM. The memory system 604 can comprise the ram cache. In various embodiments, data is stored within the memory system 604. The data within the memory system 604 may be cleared or ultimately transferred to the storage system 606.

The storage system 606 is any storage configured to retrieve and store data. Some examples of the storage system 606 are flash drives, hard drives, optical drives, and/or magnetic tape. In some embodiments, the digital device 600 includes a memory system 604 in the form of RAM and a storage system 606 in the form of flash data. Both the memory system 604 and the storage system 606 comprise computer readable media which may store instructions or programs that are executable by a computer processor including the processor 602.

The communication network interface (com. network interface) 608 can be coupled to a data network (e.g., data network 504 or 514) via the link 616. The communication network interface 608 may support communication over an Ethernet connection, a serial connection, a parallel connection, or an ATA connection, for example. The communication network interface 608 may also support wireless communication (e.g., 602.11 a/b/g/n, WiMax). It will be apparent to those skilled in the art that the communication network interface 608 can support many wired and wireless standards.

The optional input/output (I/O) interface 610 is any device that receives input from the user and output data. The optional display interface 612 is any device that may be configured to output graphics and data to a display. In one example, the display interface 612 is a graphics adapter.

It will be appreciated by those skilled in the art that the hardware elements of the digital device 600 are not limited to those depicted in FIG. 6. A digital device 600 may comprise more or less hardware elements than those depicted. Further, hardware elements may share functionality and still be within various embodiments described herein. In one example, encoding and/or decoding may be performed by the processor 602 and/or a co-processor located on a GPU.

The above-described functions may be performed in hardware. In one example, the functions may be performed by one or more field-programmable gate arrays (FPGAs), discrete hardware, and/or one or more application-specific integrated circuits (ASICs).

Further, one or more functions may be stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

Various embodiments are described herein as examples. It will be apparent to those skilled in the art that various modifications may be made and other embodiments can be used without departing from the broader scope of the present invention. Therefore, these and other variations upon the exemplary embodiments are intended to be covered by the present invention(s).

The invention claimed is:

1. A system comprising:
    a linearizer configured to use a predistortion control signal to add predistortion to a receive signal to generate a predistorted signal;
    a power amplifier configured to amplify power of the predistorted signal to generate a first amplified signal, the power amplifier adding at least one of high side distortion or low side distortion to the predistorted signal, the at least one of the high side distortion or the low side distortion cancelling at least a portion of the predistortion; and
    a feedback block configured to capture a feedback signal based on a previous amplified signal from the power amplifier, to separately sample a high side lobe and a low side lobe of the captured feedback signal, to detect one of high side distortion associated with the high side lobe or low side distortion associated with the low side lobe based on the sampling, and to generate the predistortion control signal based on the one of the high side distortion or the low side distortion detected in the captured feedback signal.

2. The system of claim 1, wherein the feedback block is further configured to separately determine the high side distortion of the captured feedback signal and separately determine the low side distortion of the captured feedback signal.

3. The system of claim 2, wherein the feedback block is further configured to generate the predistortion control signal based on the high side distortion and the low side distortion.

4. The system of claim 3, wherein the linearizer is further configured to use the predistortion control signal based on the high side distortion and the low side distortion to add predistortion to the receive signal.

5. The system of claim 1, wherein the feedback block is further configured to simultaneously or near simultaneously determine the high side distortion and the low side distortion of the captured feedback signal.

6. The system of claim 5, wherein the feedback block is further configured to generate the predistortion control signal based on both the high side distortion and the low side distortion.

7. The system of claim 6, wherein the linearizer is further configured to use the predistortion control signal based on the high side distortion and the low side distortion to add predistortion to the receive signal.

8. The system of claim 2, wherein the feedback block is further configured to compare the high side distortion and the low side distortion to at least one reference signal and generate the predistortion control signal based on the comparison.

9. The system of claim 1, further comprising a sampling oscillator configured to assist in serially sampling the low side distortion of the captured feedback signal and the high side distortion of the captured feedback signal.

10. A method comprising:
adding predistortion to a receive signal to generate a predistorted signal, the added predistortion being based on a predistortion control signal;
amplifying power of the predistorted signal with a power amplifier to generate an amplified signal, the power amplifier adding one of high side distortion or low side distortion to the predistorted signal, the high side and low side distortion cancelling at least a portion of the predistortion;
capturing a feedback signal based on a previous amplified signal from the power amplifier;
sampling a high side lobe of the captured feedback signal to detect high side distortion associated with the previous amplified signal;
separately sampling low side lobe of the captured feedback signal to detect low side distortion associated with the previous amplified signal;
detecting distortion associated with one of the high side lobe or the low side lobe based on the sampling of the high side lobe and the low side lobe; and
generating the predistortion control signal based on the distortion associated with the one of the high side lobe or the low side lobe.

11. The method of claim 10, wherein sampling the high side lobe and the low side lobe of the captured feedback signal comprises sampling the high side lobe of the captured feedback signal and sampling the low side lobe of the captured feedback signal.

12. The method of claim 11, wherein generating the predistortion control signal based on the distortion comprises generating the predistortion control signal based on one of high side distortion associated with the high side lobe or low side distortion associated with the low side lobe.

13. The method of claim 12, wherein adding the predistortion to the receive signal to generate the predistorted signal, the added predistortion being based on the predistortion control signal, comprises:
adding predistortion to the receive signal to generate the predistorted signal, the added predistortion being based on the predistortion control signal, the predistortion control signal being based on the distortion associated with the one of the high side lobe or the low side lobe.

14. The method of claim 10, wherein detecting the distortion associated with the one of the high side lobe or the low side lobe of the captured feedback signal comprises simultaneously or near simultaneously determining high side distortion associated with the high side lobe and low side distortion associated with the low side lobe of the captured feedback signal.

15. The method of claim 14, wherein generating the predistortion control signal based on the high side distortion and the low side distortion comprises generating the predistortion control signal based on both the high side distortion and the low side distortion.

16. The method of claim 15, wherein adding predistortion to the receive signal to generate the predistorted signal comprises adding predistortion based on the predistortion control signal, the predistortion control signal being based on both the determined high side distortion and the determined low side distortion.

17. The method of claim 10, wherein generating the predistortion control signal based on the high side distortion and the low side distortion comprises comparing the high side distortion and the low side distortion to at least one reference signal and generating the predistortion control signal based on the comparison.

18. The method of claim 10, further comprising serially sampling the low side distortion of the captured feedback signal and the high side distortion of the captured feedback signal.

19. A system comprising:
a linearizer configured to use a predistortion control signal to add predistortion to a receive signal to generate a predistorted signal;
a power amplifier configured to amplify power of the predistorted signal to generate a first amplified signal, the power amplifier adding at least one of high side distortion or low side distortion to the predistorted control signal, the at least one of the high side distortion or the low side distortion cancelling at least a portion of the predistortion;
means to capture a feedback signal based on a previous amplified signal from the power amplifier;
means to separately sample a high side lobe and a low side lobe of the captured feedback signal;
means to detect one of high side distortion associated with the high side lobe or low side distortion associated with the low side lobe based on the sampling; and
means to generate the predistortion control signal based on the one of the high side distortion or the low side distortion detected in the captured feedback signal.

* * * * *